United States Patent [19]

Nguyen

[11] Patent Number: 5,319,592
[45] Date of Patent: Jun. 7, 1994

[54] FUSE-PROGRAMMING CIRCUIT

[75] Inventor: Huy S. Nguyen, Fremont, Calif.

[73] Assignee: Fujitsu Limited, Kawasaki, Japan

[21] Appl. No.: 981,797

[22] Filed: Nov. 25, 1992

[51] Int. Cl.$^5$ ............................................. G11C 17/00
[52] U.S. Cl. .................................... 365/96; 365/225.7
[58] Field of Search .................... 365/96, 225.7, 200; 307/350, 355; 257/529

[56] References Cited

U.S. PATENT DOCUMENTS

| | | | |
|---|---|---|---|
| 4,532,607 | 7/1985 | Uchida | 365/96 |
| 4,614,881 | 9/1986 | Yoshida | 365/200 |
| 4,803,382 | 2/1989 | Tanimoto | 307/355 |
| 4,935,899 | 6/1990 | Morigami | 365/225.7 |
| 5,209,831 | 4/1993 | Wakamatsu | 365/200 |

FOREIGN PATENT DOCUMENTS 59-171318  9/1984  Japan .

Primary Examiner—Eugene R. LaRoche
Assistant Examiner—A. Zarabian
Attorney, Agent, or Firm—Christie, Parker & Hale

[57] ABSTRACT

A fuse programming circuit having reduced energy consumption is coupled between a first potential and a second potential for providing a programmable voltage level at an output node. The electrical circuit has a fuse element having a first terminal coupled to the output node and a second terminal coupled to the first potential. The electrical circuit also has means for providing a path for passing electrical charge between the second potential and the output node, which the path between the second potential and the output node has substantially infinite resistance when the electrical charge is being transferred.

40 Claims, 7 Drawing Sheets

FUSE-PROGRAMMING CIRCUIT

TECHNICAL FIELD OF THE INVENTION

The present invention relates in general to a fuse programming circuit that can be used advantageously in a memory device for substituting defective memory cells with functional redundant cells. Specifically, the present invention is related to means and method for reducing power consumption of a fuse programming circuit.

BACKGROUND OF THE INVENTION

In the manufacture of semiconductor memory devices, it is known that production yield can be increased by provision of a set of redundant cells. With the availability of redundant cells, a certain number of defective cells in a device become tolerable because they can be substituted by the redundant cells. The increased tolerance allows production yield to increase.

In a typical manufacturing process of memory devices with redundant cells, a test is performed after a memory device is fabricated to determine if it contains any defective cells. If a defective cell is found, the entire row or column of cells containing the defective cell is substituted. The substitution is achieved by programming the row or column address into an internal programming circuit. During normal operation of the memory, if the address of an memory access is the same as the content of the programming circuit, the access is directed to the redundant cells.

The programming circuit typically comprises a set of fuse elements, each for programming an address bit. The number of fuse elements provided in the programming circuit depends upon the substitution scheme. For example, if the substitution is performed on a row basis (i.e. the entire row of cells is substituted when one cell therein is found to be defective), then the number of fuse elements required may be equal to the width of the row address. On the other hand, if the substitution is performed on a column basis (i.e. the entire column of cells is substituted when one cell therein is found to be defective), then the number of fuse elements required may be equal to the width of the column address.

In most prior art fuse programming circuits, each fuse element is connected in series with a resistor between a first voltage source (e.g. Vdd) and a second voltage source (e.g. Vss) as shown in FIG. 1. The programming circuit is programmed by selectively removing the fuse elements based upon the row or column address of the defective cell. The fuse can be removed either by laser-cutting or by passing a sufficiently high current through the fuse. A specific example of the later technique is disclosed in U.S. Pat. No. 4,532,607 issued on Jul. 30, 1985 to Y. Uchida.

When the fuse is removed, the output voltage of the circuit is equal to Vdd. When the fuse element is kept, the output voltage is equal to Vss. The output voltage level represents the binary value of the corresponding bit in forming a defective cell's address.

One problem with the above described prior art fuse programming circuit is that when the fuse element is preserved, a constant current flows through the resistor from Vdd to Vss,, causing power consumption and heat dissipation. To reduce such power consumption and heat dissipation, the value of the resistor can be increased. Unfortunately, the resistance required is typically in the order of megohms. To provide a resistance of such magnitude requires a high-resistive mask layer and such a requirement is undesirable in a semiconductor manufacturing process.

SUMMARY OF THE INVENTION

The present invention provides a fuse programming circuit that can be used advantageously in a memory device for substituting defective cells with redundant memory cells. The fuse programming circuit according to the present invention has reduced power consumption and heat dissipation. The reduction is achieved by reducing the current that flows through the fuse, in the presence thereof, without having to use a high value resistor.

The present invention discloses an electrical circuit coupled between a first potential and a second potential for providing a programmable voltage level at an output node. The electrical circuit comprises a fuse element having a first terminal coupled to the output node and a second terminal coupled to the first potential. The electrical circuit according to the present invention also comprises means for providing a path for passing electrical charge between the second potential and the output node, wherein the path between the second potential and the output node has substantially infinite resistance when electrical charge passes through.

The present invention also relates to a memory device having an array of memory cells and an array of redundant memory cells. The memory device according to the present invention has a programming circuit providing a programmable output voltage at an output node for selecting the redundant cells, comprising a fuse element having a first terminal and a second terminal, the first terminal receiving a first potential and a second terminal connected to the output node. It also comprises means connected to a second potential for intermediately storing electrical charge when said electrical charge moves between the second potential and the output node.

The present invention also relates to an electrical circuit coupled between a first potential and a second potential for providing a programmable output voltage. The electrical circuit comprises a fuse, a first switch, and a second switch, wherein a first terminal of the fuse being connected to a first terminal of the first switch at a first node, wherein a first terminal of the second switch being connected to a second terminal of the first switch at a second node, and wherein the second node having a capacitance for storing electrical charge.

The present invention also relates to a fuse programming circuit having a fuse for providing a programmable output voltage at an output node. The present invention discloses a method f or reducing current consumption in a fuse programming circuit, comprising the steps of coupling a capacitive element to a voltage source, decoupling said capacitive element from said voltage source, and then coupling said capacitive element to said output node.

BRIEF DESCRIPTION OF THE DRAWINGS

FIGS. 2b–2d are schematic circuit diagrams illustrating alternative implementations of the circuit shown in FIG. 2a.

FIGS. 4b–4d are schematic circuit diagrams illustrating alternative implementations of the circuit shown in FIG. 4a.

DESCRIPTION OF THE EMBODIMENTS

Figure 1:
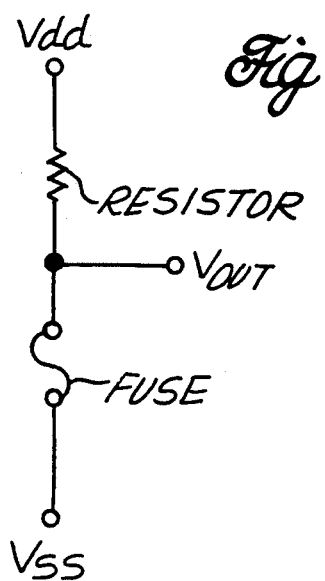
FIG. 1 is a schematic diagram illustrating a prior art fuse programming circuit.
Figure 2A:
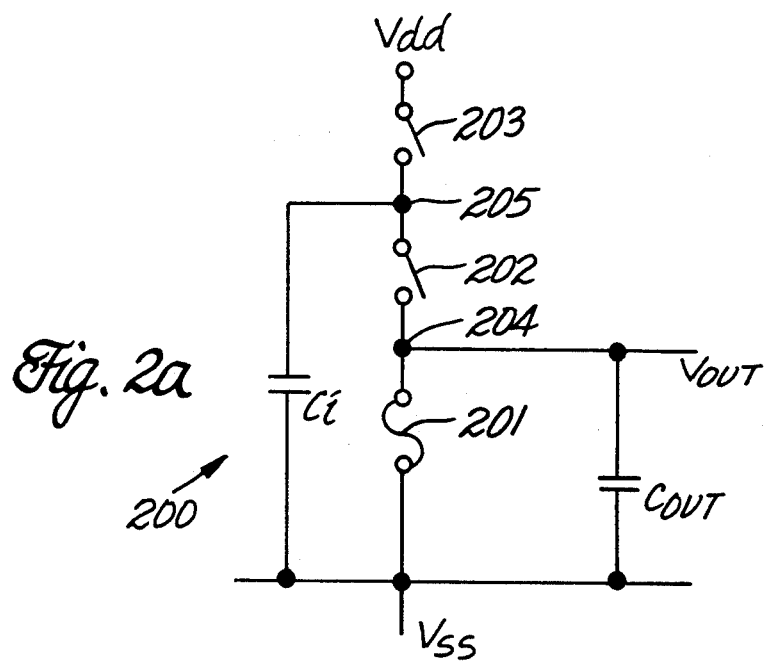
FIG. 2a is a schematic circuit diagram illustrating a fuse programming circuit which embodies the present invention.

FIG. 2a is a schematic diagram of a circuit 200 provided herein to illustrate the principles of operation of an embodiment of the present invention. The diagram shows a fuse element 201 connected between an output node 204 and a first voltage source Vss. The output node 204 is connected serially through a first switch 202 and a second switch 203 to a second voltage source Vdd. The first switch 202 is connected to the second switch 203 at a node 205. Present between the node 205 and the voltage source Vss is a capacitance Ci. Ci may be parasitic capacitance of the circuit 200. However, if capacitance Ci needs to be increased for reasons to be described hereinafter, capacitive elements can be added thereto. Also present in the circuit 200 is a capacitance Cout between the output node 204 and Vss1 which may be the output capacitive loading or parasitic capacitance (such as the capacitance caused by the removal of the fuse) of the circuit 200.

Advantageously, switches 202 and 203 are controlled in such a way that they do not close concurrently. More specifically, when switch 202 is closed, switch 203 would be opened, and when switch 203 is closed, switch 202 would be opened. Therefore, the resistance along the path from Vdd, through switch 203, switch 202 and the fuse 201, to Vss is substantially infinite.

The circuit 200 can be programmed by either removing the fuse element 201 or keeping it in the circuit. The fuse element can be removed either by laser-cutting or by providing a sufficiently high current from a circuit (not shown) to the fuse. An example of such circuit can be found in FIG. 3 of the above-identified patent to Uchida.

Consider the situation when the fuse 201 is not removed.

When switch 203 is closed, switch 202 is opened and capacitor Ci is connected to Vdd. Voltage source Vdd charges Ci to a voltage of Vdd-Vss. The electrical charge Qi stored in Ci is:

$$Qi = Ci*(Vdd - Vss)$$

When switch 203 is opened, switch 202 is closed and capacitor Ci is disconnected from Vdd and connected to the fuse 201. The electrical charge Qi stored in Ci is thereby discharged. If switches 202 and 203 continue to open and close periodically, the average current I passing through the fuse 201 is:

I = Qi/T, where T is the time period between successive opening and closing of switches 202 and 203.
= Ci*(Vdd−Vss)/T For example, if Ci=0.1 pF, T=14.2 ns and Vdd−Vss=3.6V, the average current passing through the fuse 201 will be 0.025 mA (approx).

The current flowing to the output 204 can be assumed to be negligible because the resistance of the fuse 201 is typically much lower than the resistance of the output load.

Consider the situation when the fuse 201 is removed.

When switch 203 is closed, switch 202 is opened and capacitor Ci is connected to the Vdd. Voltage source Vdd charges Ci to a voltage of Vdd−Vss. The electrical charge Qi stored in Ci is:

$$Qi = Ci*(Vdd - Vss)$$

When switch 202 is closed, switch 203 is opened and electrical charge stored in Ci will flow into Cout since Ci has a higher voltage than Cout. The charge Q1 stored in Cout then becomes:

$$Q1 = Qi*Cout/(Ci+Cout)$$

$$= Qi*K, \text{ where } K = Cout/(Ci+Cout)$$

The voltage Vout1 across both Ci and Cout is:

$$Vout1 = Qi/(Ci+cout)$$

In the next cycle, when switch 202 is again opened and switch 203 is closed, Ci is charged by Vdd to a voltage higher than Vout1. When the switch 203 is closed for a sufficiently long period of time, Ci will be charged back to a voltage of (Vdd−Vss). The electrical charge stored therein is again equal to Qi.

When switch 202 is closed and switch 203 is opened in the next cycle, electrical charge stored in Ci will again flow into Cout since the voltage across Ci is still higher than Vout1. The total charge stored in Ci and Cout becomes:

$$Qtotal = Qi + Q1$$

The charge Q2 stored in Cout is:

$$\begin{aligned} Q2 &= Qtotal*Cout/(Ci + Cout) = Qtotal*K \\ &= (Qi - Q1)*K = (Qi + Qi*K)*K \\ &= Qi*(1 + K)*K = Qi(K + K^2) \end{aligned}$$

Similarly, the charge Q3 stored in Cout after the third cycle is:

$$\begin{aligned} Q3 &= (Qi + Q2)*K = (Qi + Qi*(K + K^2)*K \\ &= Qi*(1 + K + K^2)K = Qi*(K + K^2 + K^3) \end{aligned}$$

In general, the electrical charge Qn stored in Cout after n cycles is:

$$Qn = Qi*(K + K^2 + \ldots K^n)$$

The voltage Vout at the output node after n cycles is:

$$\begin{aligned}
V_{out} &= Q_n/C_{out} \\
&= Q_i*(K + K^2 \ldots K^n)/C_{out} \\
&= (V_{dd} - V_{ss})*C_i/C_{out}*(K + K^2 \ldots K^n) \\
&= (V_{dd} - V_{ss})*(C_i/C_{out})*(K^n - 1)/(1 - 1/K) \\
&= (V_{dd} - V_{ss})*(C_i/C_{out})*\{[C_{out}/(C_i + C_{out})]^n - 1\}/ \\
&\quad \{1 - 1/[C_{out}/(C_i + C_{out})]\} \\
&= (V_{dd} - V_{ss})*(C_i/C_{out})*\{[1/(1 + C_i/C_{out})]^n - 1\}/ \\
&\quad \{1 - (C_i + C_{out})/C_{out}\}
\end{aligned}$$

Since $(1+C_i/C_{out}) > 1$, as n approaches infinity, $C_i/C_{out}*(K+K^2 \ldots K^n)$ approaches 1 and Vout approaches $(V_{dd}-V_{ss})$.

As an example, if the capacitance Ci is equal the capacitance Cout, K then has a value of 0.5, the value of Vout will approach 97% of Vdd after switches S1 and S2 have each opened and closed 5 times (in other words, after 5 cycles). It can be seen that the number of cycles for charging Cout to Vdd is a function of K, which is a function of Ci/Cout. It can also be seen that the higher the ratio of Ci/Cout, the less cycles it takes for Vout to approach Vdd. While the circuit may operate even if the parasitic capacitance is relied upon to provide Ci, better response can be achieved if the value of Ci is increased by adding capacitive elements.

In the above description, it has been assumed that switch 203 is closed for a sufficient long time period to allow Ci to be charged to a voltage of Vdd−Vss. However, such assumption is made for convenience of discussion and is not necessary for the circuit to operate as intended. The reason is because, in operation, the voltage across Ci is at least equal to, if not higher than, the voltage across Cout. Each time Ci is coupled by the closing of switch 203 to Vdd, its voltage level increases further. Thus, even if switch 203 is not closed for a sufficiently long time period, the resultant voltage across Ci will, after such closing, still be higher than Vout. Therefore, when Ci is coupled to Cout, it can still supply electrical charge to Cout to gradually increase the voltage of Vout.

It can be seen that as switches 202, 203 do not close concurrently, the path from Vdd to Vout has substantially infinite resistance. It has been shown, however, that, even though the path has infinite resistance, electrical charge still passes between Vdd and Vout. This is because the circuit stores the electrical charge intermediately in capacitor Ci when switch 203 is closed and switch 202 is opened, and releases them when switch 203 is opened and switch 202 is closed.

Figure 2B:
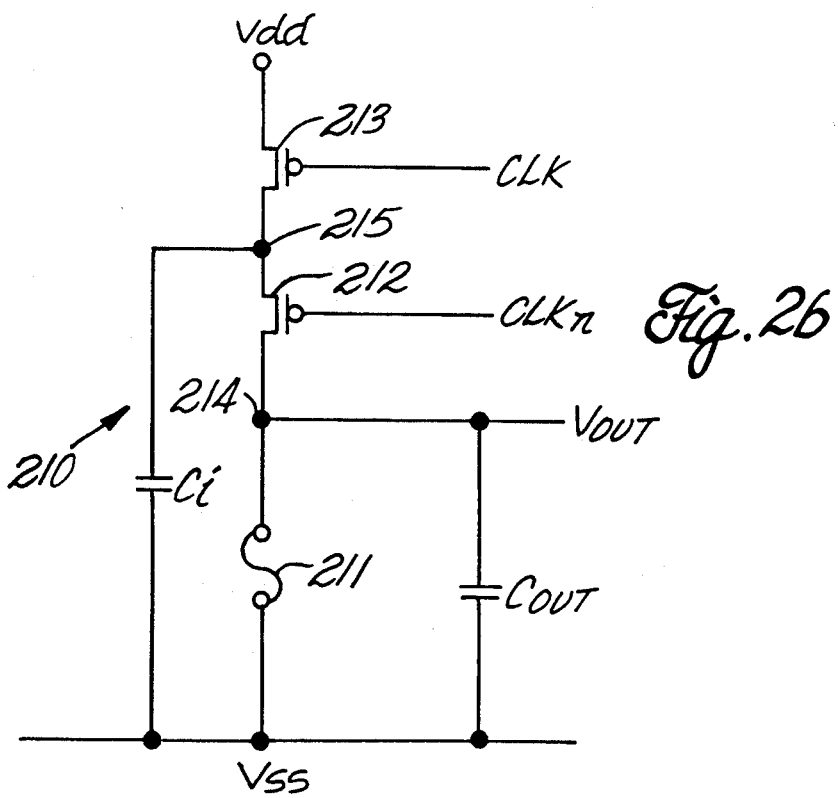

FIG. 2b is a schematic diagram of a circuit 210 illustrating one specific implementation of the circuit 200 shown in FIG. 2a. The circuit 210 has the same general construction as circuit 200, with the exception that switch 202 is implemented by a transistor such as a p-channel metal-oxide semiconductor (PMOS) transistor 212 and switch 203 is replaced by a transistor 213 such as another PMOS transistor.

Figure 7:
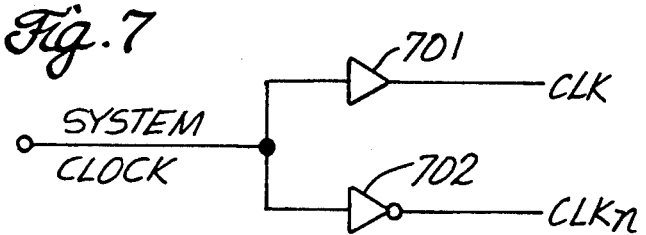
FIG. 7 is a schematic circuit diagram illustrating how the signals clk and clkn, which can be used to operate the fuse programming circuits, can be generated.
Figure 8A:
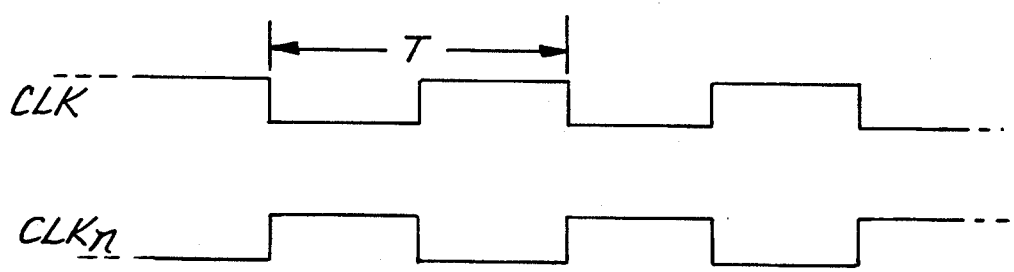
FIGS. 8a and 8b are timing diagrams illustrating clock signals capable of operating the transistors in the circuits shown in FIG. 2b and FIG. 4b.

The control terminal of transistor 213 is connected to a signal clk. The control terminal of transistor 212 is connected to a signal clkn. Signals clk and clkn are periodical signals as illustrated in either FIG. 8a or FIG. 8b. When clk turns on transistor 213, clkn would shut off transistor 212; and when clkn turns on transistor 212, clk would shut off transistor 213. Both clk and clkn may be derived from the system clock (e.g. the clock which operates the memory device) by passing it through a driver 701 and an invertor 702, as shown in FIG. 7. They may, however, be generated separately from the system clock.

Figure 8B:
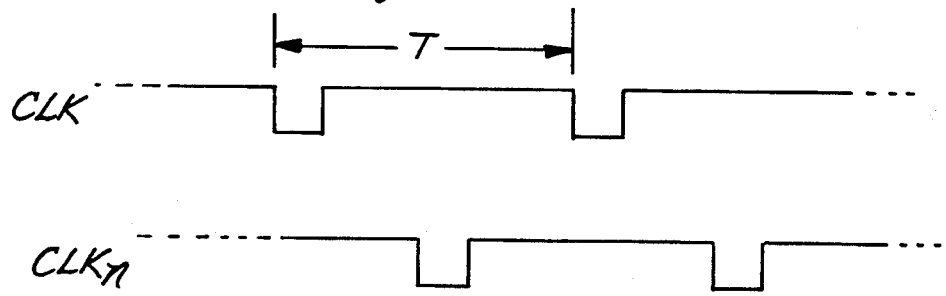

Preferably, signals clk and clkn are such that the closing of transistors 212 and 213 do not overlap. Otherwise, current would flow through the circuit, undesirable consuming energy. However, the signals clk and clkn need not switch simultaneously. It is sufficient to provide clk and clkn such that clk would have switched off transistor 213 before clkn switches on transistor 212, and vice versa, as shown in FIG. 8b.

In operation, when clk is low, clkn is high, transistor 213 is turned on and transistor 212 is turned off. As a result, capacitor Ci is charged by Vdd through transistor 213.

Thereafter, signal clk reverses, turning off transistor 213, and signal clkn also reverses, turning on transistor 212. If the fuse 211 is not removed, the electrical charge stored in Ci will be discharged. If the fuse 211 is removed, electrical charge stored in Ci will flow to Cout to equalize the voltage between Ci and Cout. The electrical charge will flow from Ci to Cout either until the voltage across Ci is equal to the voltage across Cout, or until the voltage at node 215 reaches a level that is equal to the low voltage level of clkn plus the absolute value of the threshold voltage of transistor 212.

Figure 2C:
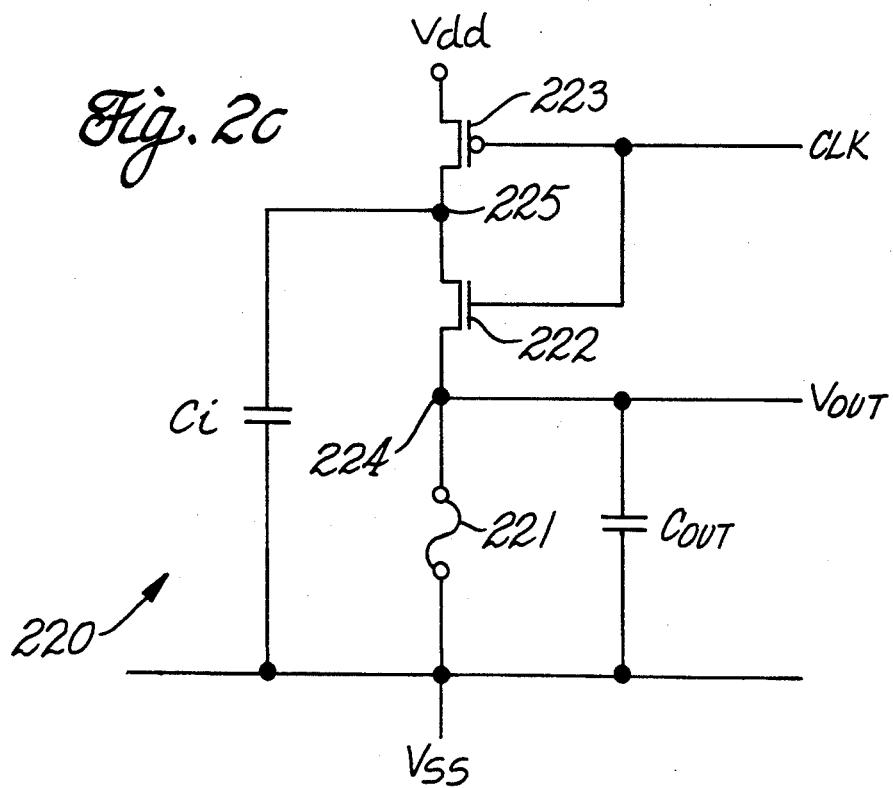

FIG. 2c is a schematic diagram of a circuit 220 illustrating another specific implementation of the circuit 200 shown in FIG. 2a. The circuit 220 has the same general construction as circuit 200, with the exception that switch 202 is replaced by an n-channel MOS (NMOS) transistor 222 and switch 203 is replaced by a PMOS transistor 223.

The control terminals of both transistor 223 and 222 are connected to a signal clk. Because transistors 222 and 223 have different types of channels, when signal clk causes one transistor to conduct, it would cause the other transistor to shut off.

In operation, when clk is low, transistor 223 is turned on and transistor 222 is turned off. As a result, capacitor Ci is charged by Vdd through transistor 223.

When signal clk reverses, transistor 223 is turned off and transistor 222 is turned on. If the fuse 221 is not removed, the electrical charge stored in Ci will be discharged by the fuse 221. If the fuse 221 is removed, electrical charge stored in Ci will flow into Cout so as to equalize the voltage across both capacitors. The electrical charge will flow either until the voltage across Ci is equal to the voltage across Cout, or until the voltage at node 224 reaches a level that is equal to the high voltage level of clk minus the absolute value of the threshold of transistor 222.

Advantageously, because circuit 220 operates with one signal, clk, the need to ensure that transistors 222 and 223 operate in complement of each other is simplified.

Figure 2D:
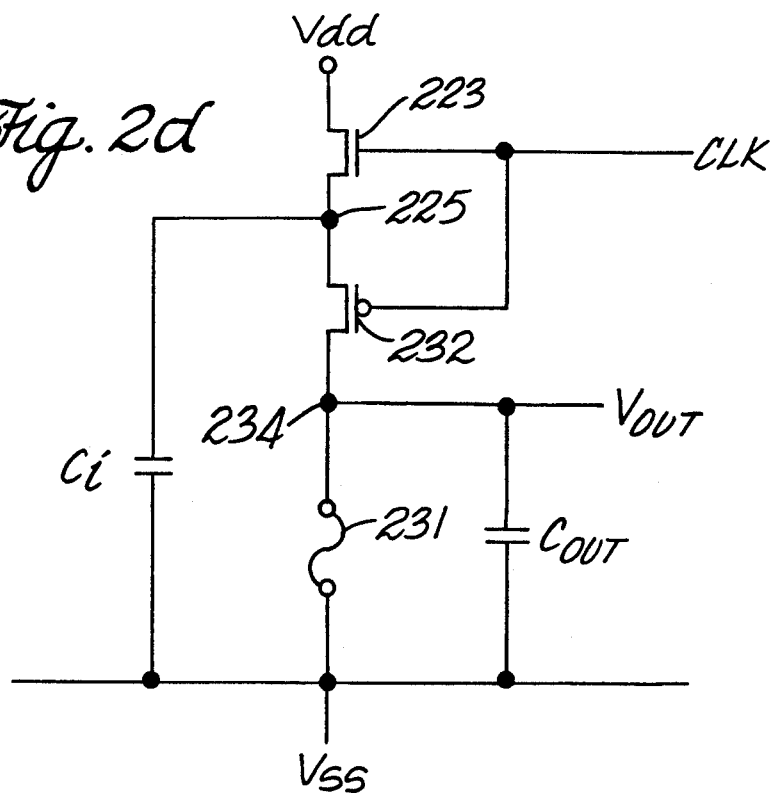

FIG. 2d is a schematic diagram of a circuit 230 illustrating yet another specific implementation of the circuit 200 shown in FIG. 2a. The circuit 230 has the same general construction as circuit 200 with the exception that switch 202 is replaced by an PMOS transistor 232 and switch 203 is replaced by an NMOS transistor 233. The operations of circuit 230 is similar to the operations of circuit 220.

Figure 3:
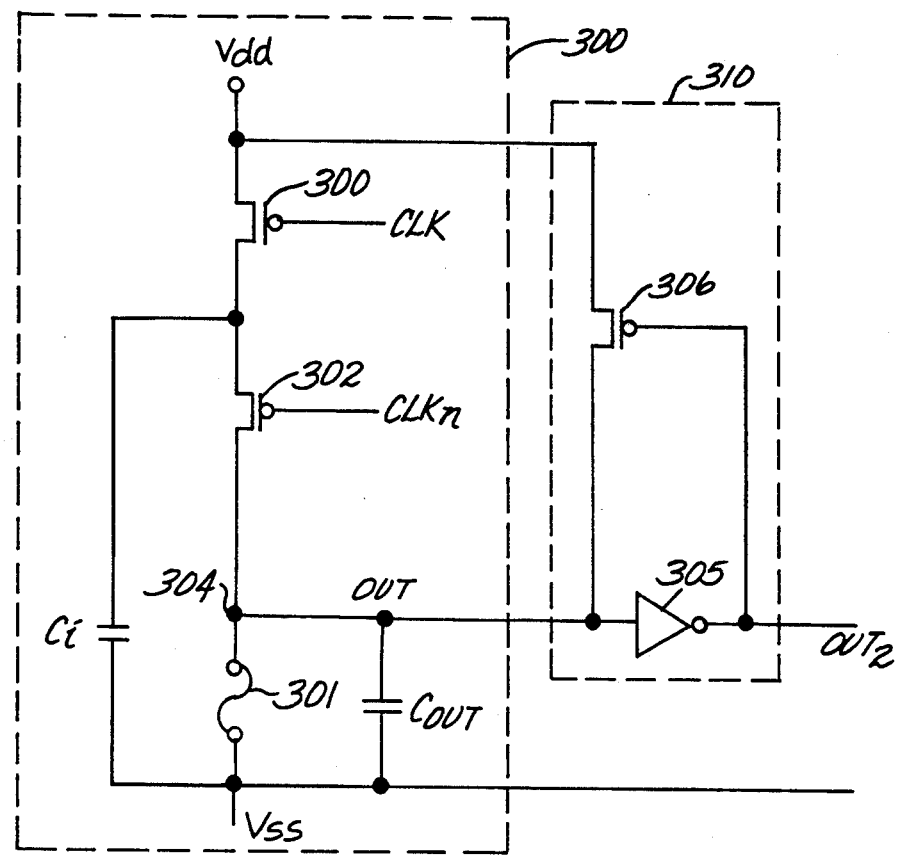
FIG. 3 is a schematic circuit diagram illustrating how response time of the circuits of FIGS. 2a–2d can be improved.

FIG. 3 is a schematic diagram illustrating another embodiment of the present invention. The circuit comprises a block 300 which has a similar circuit as circuit 210 in FIG. 2b. The output of block 300 is coupled to an invertor 305. The output of invertor 305 is connected to the control terminal of a PMOS transistor 306. One terminal of the transistor 306 is connected to Vdd. The other terminal of transistor 306 is connected to the input of invertor 305.

In operation, when the fuse 301 is removed, the voltage at the output of block 300, Vout, will rise as described above. When Vout rises to a threshold level, the invertor 305 is activated to generate a low output voltage, which then turns on transistor 306 and pulls Vout to Vdd. The rise time of Vout is thus decreased and the response of the circuit is improved. The response time of the circuit can be adjusted by adjusting the threshold voltage that trips invertor 305, such as to produce a trip point at the first cycle of operation of the switches 302 and 303.

Figure 4A:
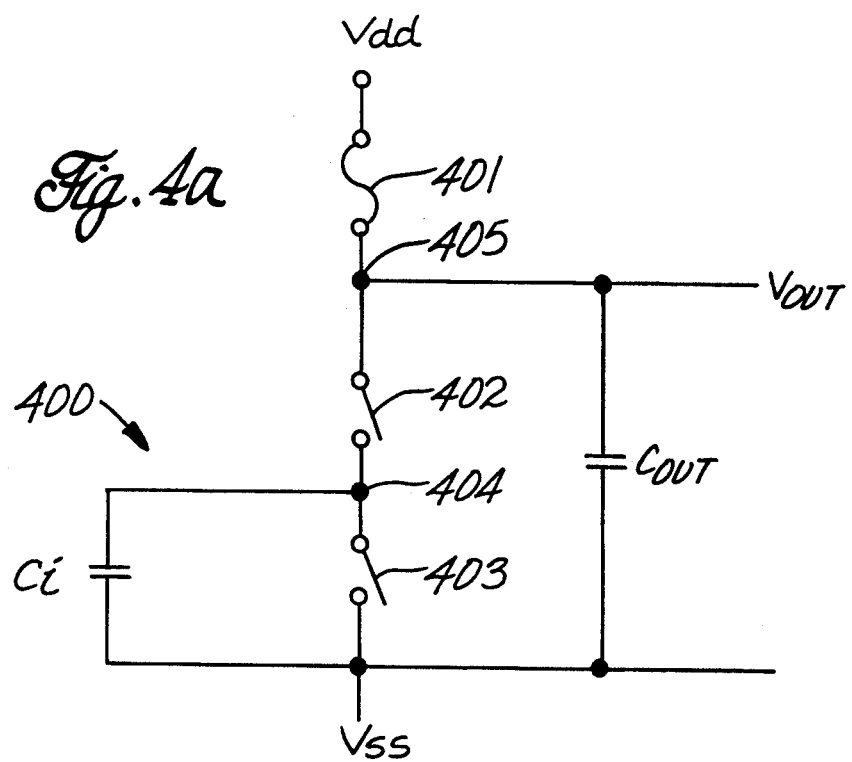
FIG. 4a is a schematic circuit diagram illustrating another fuse programming circuit which embodies the present invention.

FIG. 4a is a schematic diagram illustrating a circuit 400 which also embodies the present invention. The circuit 400 shown in FIG. 4a comprises a fuse element 401 connected between a first voltage source Vdd and an output node 405. The output node 405 is connected to a second voltage source Vss serially through a first switch 402 and a second switch 403. The first switch 402 and the second switch 403 are connected at a node 404. Present between node 404 and Vss is a capacitance Ci. Present between the output node 405 and Vss is a capacitance Cout. Each of Ci and Cout may be parasitic capacitance or capacitive loading of the circuit. However, if additional capacitance is desired, such as for improving the response time of the circuit 400, capacitive elements may be added.

The principles of operation of circuit 400 are similar to that of circuit 200. Switches 402 and 403 are controlled such that they do not close concurrently. That is, when switch 402 is closed, switch 403 would be opened, and when switch 403 is closed, switch 402 would be opened. As a result, the path from Vdd to Vss, through fuse 401, switch 402 and switch 403, has substantially infinite resistance.

The output voltage Vout of the circuit 400 can be programmed by selective removal of the fuse 401. However, contrary to circuit 200, if the fuse 401 is not removed, Vout is high, and if the fuse 401 is removed, Vout is low.

Consider the situation when the fuse 401 is not removed.

When switch 403 is closed and switch 402 is opened, Ci is shorted and discharged. When switch 402 is closed and switch 403 is opened, electrical charge is supplied from Vdd to Ci to raise its voltage back to Vdd. The electrical charge supplied to Ci is:

$$Qi = Ci*(Vdd - Vss)$$

The average current flowing through the fuse is:
I=Qi/T, where T is the time period between successive closing of switch 402
=Ci(Vdd−Vss)/T Consider the situation when the fuse 401 is removed.
When switch 403 is closed and switch 402 is opened, Ci is shorted and discharged.

When switch 402 closes and switch 403 opens, Ci and Cout become connected in parallel, and electrical charge stored in Cout would flow to Ci to equalize the voltage of the two capacitors. The electrical charge originally stored in Cout is:

$$Qout = Cout*(Vout - Vss)$$

When Ci and Cout are connected in parallel, the electrical stored in Cout become:

$$Qout*Cout/(Cout+Ci)$$

The oew output voltage, voutl, becomes:

$$Vout1 = Qout/(Cout+Ci)$$

When switch 403 is closed and switch 402 is opened in the next cycle, Ci is again shorted and discharged.

In the next cycle, when switch 402 closes and switch 403 Opens, electrical charge stored in Cout will again flow to Ci to equalize the voltage of the two capacitors. The electrical charge stored in Cout become:

$$\begin{aligned}Qout2 &= Qout1*Cout/(Cout + Ci)\\ &= Qout*(Cout/(Cout + Ci))^2\end{aligned}$$

The new output voltage, Vout2, becomes:

$$Vout2 = Qout2/Cout = Qout*(Cout/(Cout+Ci))^2$$

With successive opening and closing of switches 402 and 403, electrical charge stored in Cout is removed to Ci and the voltage Vout is lowered, until Vout approaches Vss.

In the above description, it has been assumed that switch 403 is closed for a sufficient long time period to allow Ci to be completely discharged. However,, such assumption is made for convenience of discussion and is not necessary for the circuit 400 to operate as intended. The reason is because, in operation, the voltage across Ci is at most equal to, if not lower than, the voltage across Cout. Each time Ci is shorted by the closing of switch 403, its voltage level decreases further. Thus, even if switch 403 is not closed for a sufficiently long time period, the resultant voltage across Ci will be, after such closing, lower than Vout. Therefore, when Ci is coupled to Cout, it can still remove electrical charge from Cout to gradually decrease the voltage of Vout.

Figure 4B:
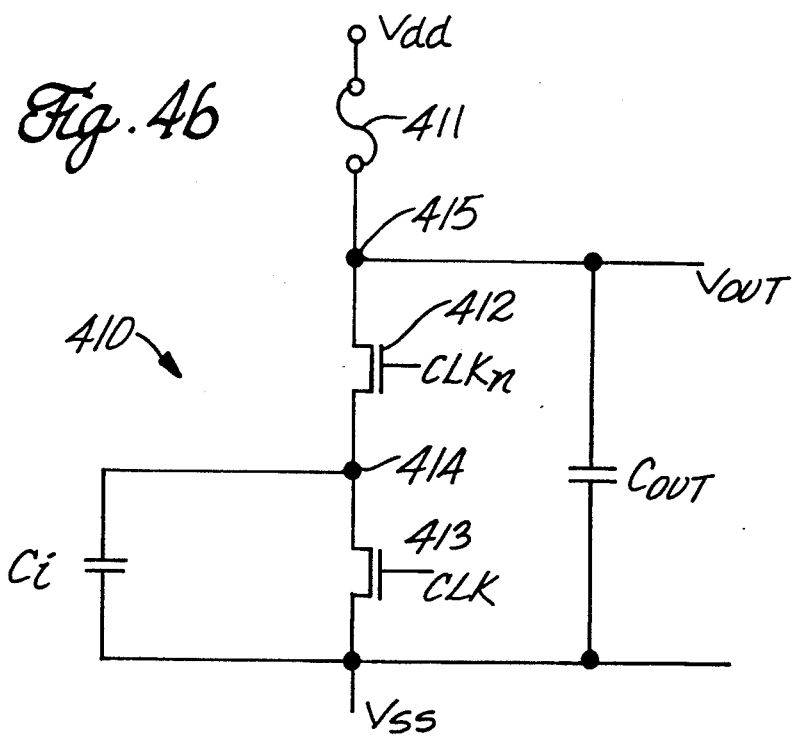

FIG. 4b is a schematic diagratft illustrating one specific implementation of circuit 400. The circuit 410 shown in FIG. 4b has the same general construction as circuit 400 of FIG. 4a. However, switch 402 is replaced by a transistor 412, such as a NMOS transistor and switch 403 is replaced by a transistor 413, such as another NMOS transistor.

The control terminal of transistor 413 is connected to a signal clk. The control terminal of transistor 412 is connected to a signal clkn. Signals clk and clkn are periodic and complementary of each other.

In operation, when clk is high and clkn is low, transistor 413 is turned on and transistor 412 is turned off. Capacitor Ci is thereby discharged.

Thereafter, signal clk changes to low and signal clkn changes to high, transistor 413 is turned off and transistor 412 is turned on. If the fuse 411 is not removed, Ci is recharged by Vdd. If the fuse 411 is removed, electrical charge stored in Cout will flow to Ci to equalize the voltage between the two capacitors. The electrical charge will flow either until the voltage across Cout is equal to the voltage across Ci, or until the voltage at node 414 reaches a level that is equal to the high voltage level of clkn minus the absolute value of the threshold of transistor 412.

Figure 4C:
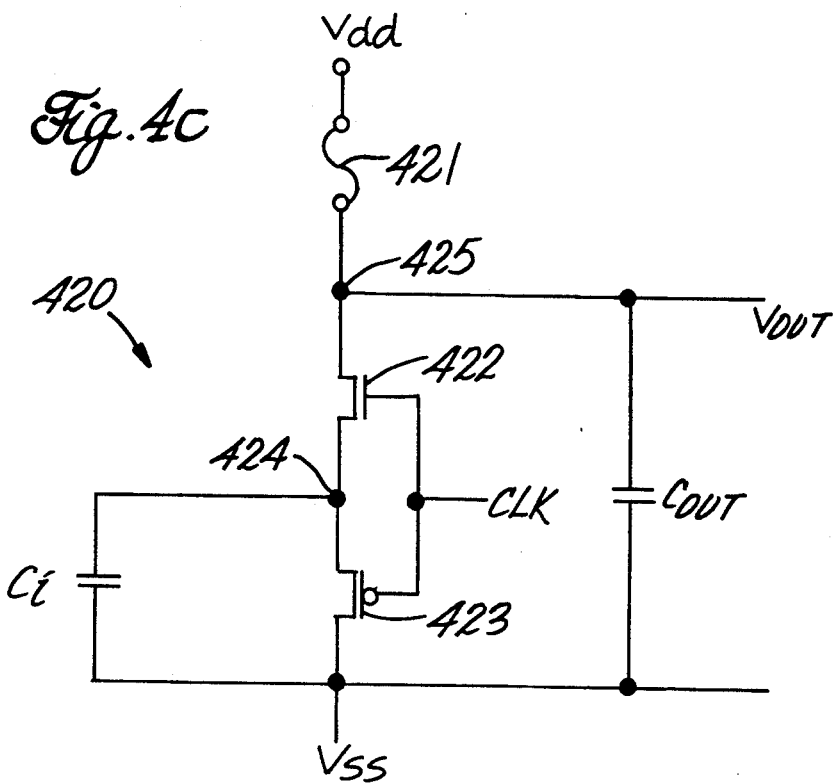

FIG. 4c is a schematic diagram of a circuit 420 illustrating another specific implementation of circuit 400. The circuit 420 shown in FIG. 4c has the same general construction as circuit 400 with the exception that switch 403 is replaced by a PMOS transistor 423 and switch 402 is replaced by an NMOS transistor 422.

The control terminals of both transistor 423 and 422 are connected to a signal clk. Because transistors 422 and 423 are of opposite types, when clk causes one transistor to conduct, it would cause the other transistor to shut off.

In operation, when clk is low, transistor 423 is turned on and transistor 422 is turned off. Transistor 423 shorts and discharges the capacitor Ci.

When signal clk reverses, transistor 423 is turned off and transistor 422 is turned on. If the fuse 411 is kept intact, Ci is recharged by Vdd. If the fuse 411 is removed, electrical charge stored in Cout would flow to Ci to equalize the voltage between the two capacitors. The electrical charge would flow either unit the voltage across Cout is equal to the voltage across Ci, or until the voltage at node 424 reaches a level that is equal to the high voltage level of clk minus the absolute value of the threshold of transistor 422.

Advantageously, because circuit 420 operates with one signal, clk, the need to ensure that transistors 422 and 423 operate in complement of each other is simplified.

Figure 4D:
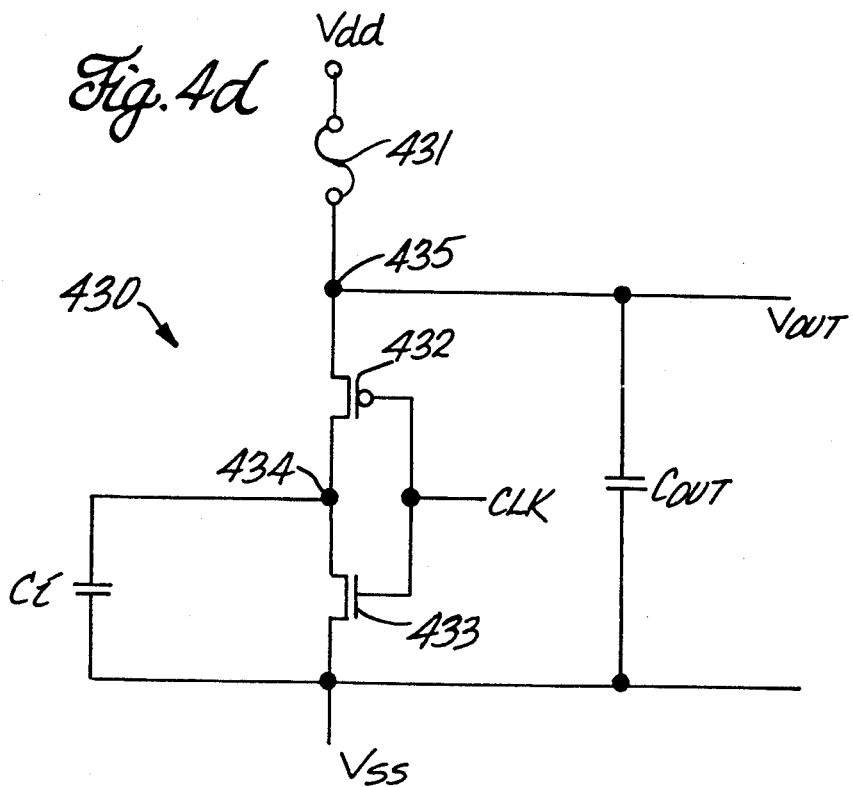

FIG. 4d is a schematic diagram illustrating yet another implementation of circuit 400. The circuit 420 shown in FIG. 4d has the same general construction as circuit 400 with the exception that switch 403 is replaced by an NMOS transistor 433 and switch 402 is replaced by a PMOS transistor 422. The operations of circuit 430 are similar to the operations of circuit 420.

Figure 5:
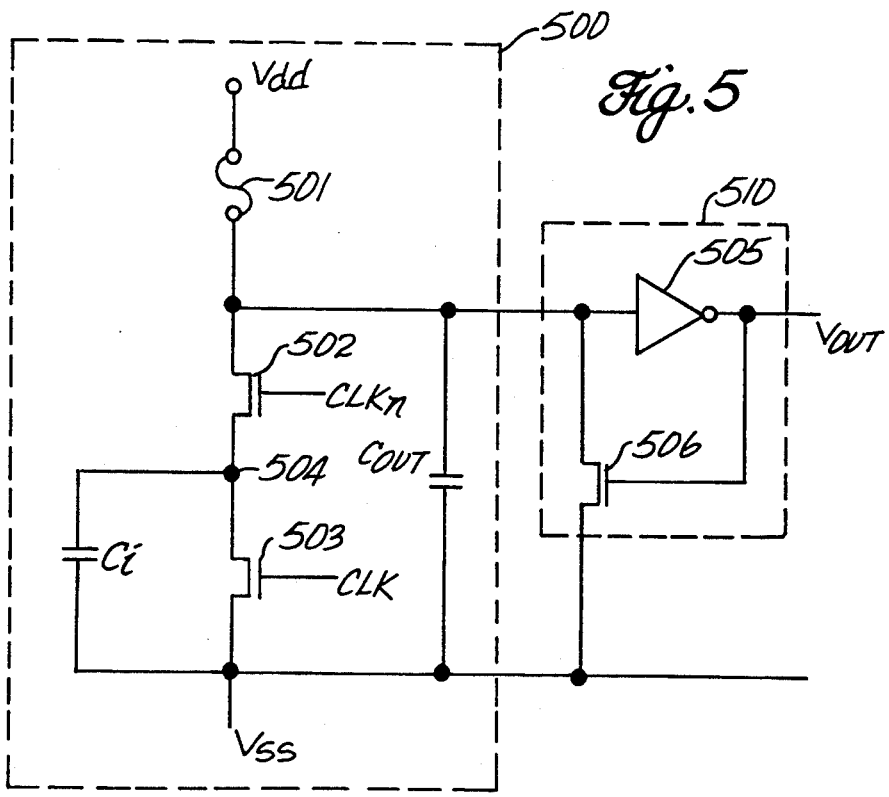
FIG. 5 is a schematic circuit diagram illustrating how the response time of the circuits of FIGS. 4a–4d can be improved.

FIG. 5 is a schematic diagram illustrating another embodiment of the present invention. The circuit comprises a block 500 which has a circuit similar to the circuit 410 shown in FIG. 4b. The output of block 500 is connected to the input of an invertor 505. The output of invertor 505 is connected to the control terminal of a NMOS transistor 506. One terminal of the NMOS transistor 506 is connected to the output of block 500. The other terminal of transistor 506 is connected to Vss.

In operation, when the fuse 501 is removed, the voltage Vout at the output of block 500 will drop as described above. When Vout drops to a threshold level, the invertor 505 is activated to generate a high output voltage, which then turns on transistor 506 and pulls Vout to Vdd. The fall time of Vout is thus decreased and the response of the circuit is improved. The response time of the circuit can be adjusted by adjusting the threshold voltage of invertor 505.

Figure 6:
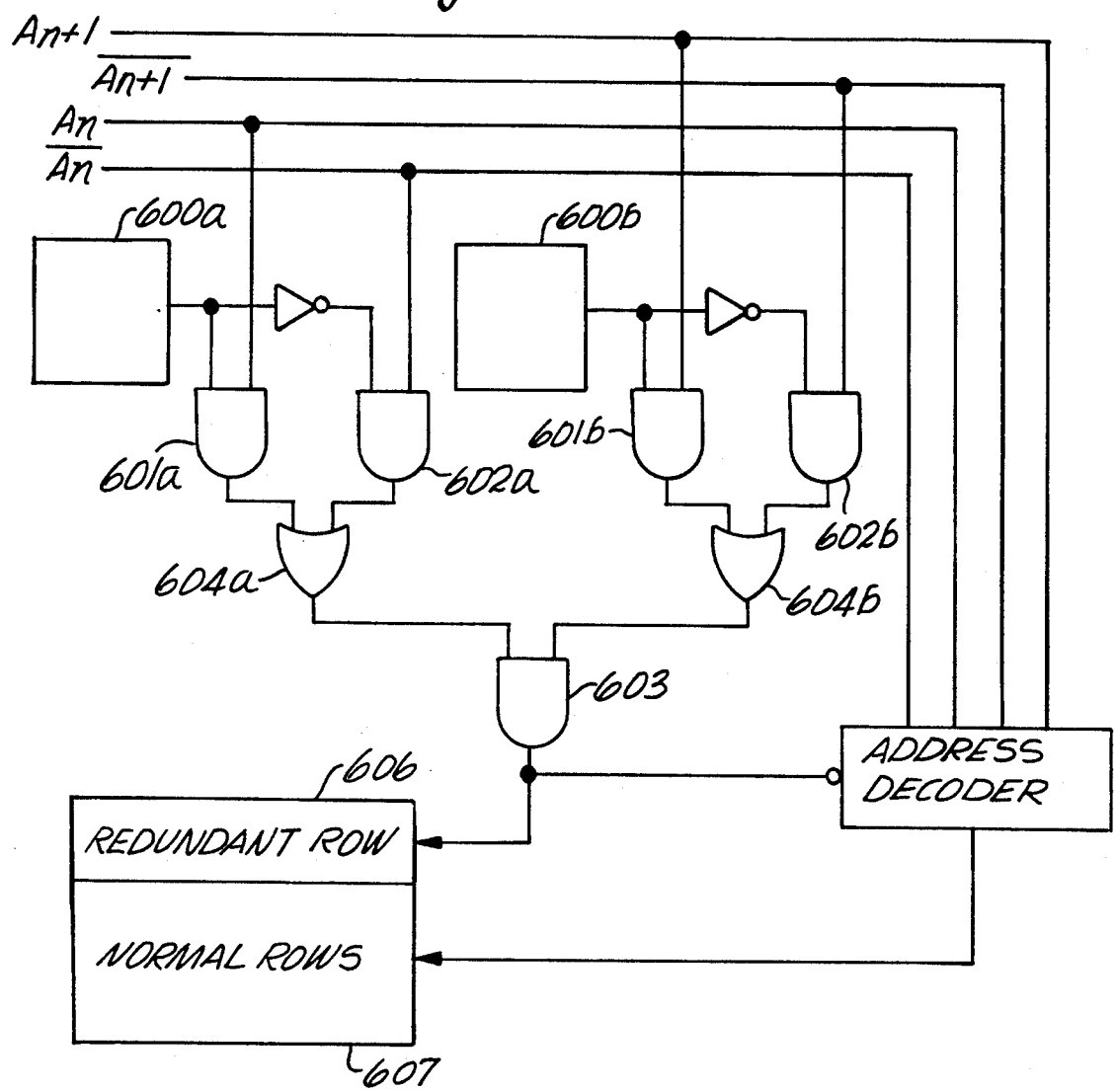
FIG. 6 is a diagram illustrating how the fuse programming circuit of the present invention can be used for substituting defective memory cells with redundant cells.

FIG. 6 is a schematic diagram illustrating how the present invention is used in a memory device for substituting a defective memory cell by a redundant cell.

The memory device comprises an array of normal memory cells 607, an array of redundant memory cells 606 and a plurality of fuse programming circuits. Only two programming circuits, 600a and 600b, are shown in FIG. 6 to facilitate discussion and illustration.

A plurality of address lines are inputted into the memory device to address the memory cells. These address lines include address bit An and its complement $\overline{An}$, and address bit An+1 and its complement $\overline{An+1}$. Address bit An is gated by an output from fuse programming circuit 600a through an AND gate 601a. Address bit $\overline{An}$ is gated by the inverted output of fuse programming circuit 600a through an AND gate 602a. The outputs of AND gates 601a and 602a are ORed by OR gate 604a and inputted into an AND gate 603. Similarly, address bit An+1 is gated by an output from fuse programming circuit 600b through an AND gate 601b. Address bit $\overline{An+1}$ is gated by the inverted output of fuse programming circuit 600b through an AND gate 602b. The outputs of AND gates 601b and 602b are ORed by OR gate 604b and inputted into the AND gate 603. If the address lines are the same as the respective values of the fuse programming circuits 600a, 600b, both inputs to the AND gate 603 are high and the output of AND gate 603 is activated.

Address lines An, $\overline{An}$, An+1 and $\overline{An+1}$ are also inputted into an address decoder 604. Normally, the address decoder 604, responsive to the address lines, generates a select signal to select a row of memory cells from 607. When the value of the address lines is equal to the value of the fuse programming circuit 600a, 600b, the output from AND gate 603 is activated, and inputted into an inhibit terminal 605 of the address decoder 604 thereby disabling the address decoder and the normal @emory cells are not selected. In its place, a row of redundant cells 606 is selected by the output from AND gate 603.

A description of the particular embodiments is given above for the understanding of the present invention. It will be understood by those skilled in the art that various modifications and additions can be made without substantially departing from the scope of this invention, which is defined by the following claims.

What is claimed is:

1. An electrical circuit coupled between a first potential and a second potential for providing a programmable voltage level at an output node, comprising:
    a fuse element having a first terminal coupled to said output node and a second terminal coupled to said first potential; and
    means for selectively providing a path for passing electrical charge between said second potential and said output node, wherein the path means has substantially infinite resistance between said second potential and said output node when said electrical charge passes through said path means.

2. An electrical circuit as in claim 1, wherein said path means comprises a first switching means, a second switching means coupled serially to said first switching means, and a capacitive means coupled to a node between said first switching means and said second switching means, and wherein said first switching means is opened when said second switching means closes, and said second switching means is opened when said first switching means closes.

3. An electrical circuit as in claim 2, wherein said first switching means comprises a first transistor and said second switching means comprises a second transistor, and wherein said electrical circuit further comprising means for generating control signals to switch said first and second transistors.

4. An electrical circuit as in claim 3, wherein said generating means applies a first control signal to said first transistor and a second control signal, complementary of the first control signal, to said second transistor.

5. An electrical circuit as in claim 3, wherein said first transistor is of a first type and said second transistor is of a second type opposite to said first type and wherein said control generating means applies one of said control signals to both a control terminal of said first transistor and a control terminal of said second transistor.

6. An electrical circuit as in claim 5, wherein said first transistor is a p-channel metal-oxide semiconductor transistor and said second transistor is an n-channel metal-oxide semiconductor transistor.

7. An electrical circuit as in claim 5, wherein said first transistor is an n-channel metal-oxide semiconductor transistor and said second transistor is a p-channel metal-oxide semiconductor transistor.

8. An electrical circuit as in claim 3, wherein said first and second transistors are metal oxide semiconductor transistors.

9. An electrical circuit as in claim 2, further comprising means coupled to said output node for improving response time of such electrical circuit, wherein said improving means comprises a driver having an input coupled to said output node and channel means responsive to an output from said driver for providing a conductive path between said second potential and said output node.

10. An electrical circuit as in claim 9, wherein said driver is an invertor and wherein said channel means is a transistor having a control terminal coupled to an output of said invertor.

11. An electrical circuit as in claim 2, wherein said second potential is higher than said first potential, and wherein said first and second switching means and said capacitive means operate to supply electrical charge from said second potential to said output node.

12. An electrical circuit as in claim 2, wherein said second potential is lower than said first potential and wherein said first and second switching means and said capacitive means operate to remove electrical charge from said output node.

13. In a memory device having an array of memory cells and an array of redundant memory cells, a programming circuit providing a programmable output voltage at an output node for selecting said redundant cells, comprising:
   a fuse element having a first terminal and a second terminal, said first terminal receiving a first potential and a second terminal coupled to said output node; and
   means for selectively moving electrical charge between a second potential and said output node, the moving means comprising means for intermediately storing said electrical charge when said electrical charge moves between said second potential and said output node.

14. A memory device as in claim 13, wherein said storing means comprises a first switch, a second switch, and a capacitor coupled in parallel with one of said first and second switches and wherein said first and second switches open and close in complement of each other.

15. A memory device as in claim 14, wherein said first switch comprises a first transistor, said second switch comprises a second transistor and wherein said programming circuit further comprises means for generating control signals to switch said first and second transistors.

16. A memory device as in claim 15, wherein said generating means applies a first control signal to said first transistor, and a second control signal, complementary of the first control signal, to said second transistor.

17. A memory device as in claim 15, wherein said first transistor is a first type and said second transistor is of a second type, opposite to said first type, and wherein said control generating means applies a control signal to a control terminal of said first transistor and a control terminal of said second transistor.

18. A memory device as in claim 17, wherein said first transistor is a p-channel metal-oxide semiconductor transistor and said second transistor is an n-channel metal-oxide semiconductor transistor.

19. A memory device as in claim 17, wherein said first transistor is an n-channel metal-oxide semiconductor transistor and said second transistor is a p-channel metal-oxide semiconductor transistor.

20. A memory device as in claim 15, wherein said first and second transistors are metal oxide semiconductor transistors.

21. A memory device as in claim 13, further comprising means coupled to said output node for accelerating response time of such electrical circuit, wherein said accelerating means comprises a driver having an input coupled to said output node and channel means responsive to an output from said driver for providing a conductive path between said second potential and said output node.

22. A memory device as in claim 21, wherein said driver is an invertor and wherein said channel means is a transistor having a control terminal coupled to an output of said invertor.

23. A memory device as in claim 14, wherein said second potential is higher than said first potential and wherein said first and second switches and said capacitor operate to intermediately store electrical charge supplied to said output node.

24. A memory device as in claim 14, wherein said second potential is lower than said first potential and wherein said first and second switches and said capacitor operate to intermediately store electrical charge removed from said output node.

25. An electrical circuit coupled between a first potential and a second potential for providing a programmable output voltage, comprising:
   a fuse,
   a first switch,
   a second switch,
   wherein a first terminal of said fuse being connected to a first terminal of said first switch at a first node,
   wherein one terminal of said second switch being connected to a second terminal of said first switch at a second node, and
   wherein said second node having a capacitance for storing electrical charge.

26. An electrical circuit as in claim 25, wherein said first and second switches open and close in complement of each other.

27. An electrical circuit as in claim 26, wherein said first switch comprises a first transistor and said second switch comprises a second transistor and wherein said electrical circuit further comprises means for generating signals to switch said first and second transistors.

28. An electrical circuit as in claim 27, wherein said generating means applies a first signal to said first transistor and a second signal, complementary of the first signal, to said second transistor.

29. An electrical circuit as in claim 27, wherein said first transistor is of a first type and said second transistor is of a second type, opposite to said first type, and wherein said generating means applies a signal to a control terminal of said first transistor and a control terminal of said second transistor.

30. An electrical circuit as in claim 29, wherein said first transistor is a p-channel metal-oxide semiconductor transistor and said second transistor is an n-channel metal-oxide semiconductor transistor.

31. An electrical circuit as in claim 27, wherein said first transistor is an n-channel metal-oxide semiconductor transistor and said second transistor is a p-channel metal-oxide semiconductor transistor.

32. An electrical circuit as in claim 27, wherein said first and second transistors are metal oxide semiconductor transistors.

33. An electrical circuit as in claim 25, further comprising means coupled to said output node for accelerating response time of such electrical circuit, wherein said accelerating means comprises a driver having an input coupled to said first node and a channel means responsive to an first from said driver for accelerating a change in voltage at said output node.

34. An electrical circuit as in claim 33, wherein said driver is an invertor and wherein said channel means is a transistor having a control terminal coupled to an output of said invertor.

35. An electrical circuit as in claim 25, further comprising a plurality of memory cells, including a set of normal memory cells and a set of redundant memory cells.

36. In a fuse programming circuit having a fuse coupled to an output node for providing a programmable output voltage at said output node, a method for reducing current consumption in the fuse programming circuit, comprising the steps of:
coupling a capacitive element to a voltage source,
decoupling said capacitive element from said voltage source, and
coupling said capacitive element to said output node, after said decoupling.

37. A memory device comprising:
an array of normal memory cells;
an address decoder for selecting a row of normal memory cells in response to an addressing signal;
an array of redundant memory cells;
a plurality of fuse programming circuits adaptable to provide a control signal representative of a first address of a row of normal memory cells; and
a control circuit for disabling the address decoder and selecting a row of redundant memory cells when the addressing signal matches the first address,
each fuse programming circuit comprising:
a fuse element having a first terminal coupled to the control circuit and a second terminal coupled to a first potential; and
means for selectively providing a path for passing electrical charge between a second potential and the control circuit, wherein the path means has substantially infinite resistance between the second potential and the control circuit when said electrical charge passes through said path means.

38. The memory device of claim 37 wherein the control signal representative of the first address is generated by opening at least one fuse element.

39. In a programmable memory device comprising an array of normal memory cells, an address decoder for selecting a row of normal memory cells in response to an addressing signal, an array of redundant memory cells, a plurality of fuse programming circuits adaptable to provide a control signal representative of a first address of the row of normal memory cells, and a control circuit for disabling the address decoder and selecting a row of redundant memory cells when the addressing signal matches the first address, each fuse programming circuit comprising a fuse element having a first terminal coupled to the control circuit and a second terminal coupled to a first potential, and means for selectively providing a path for passing electrical charge between a second potential and the control circuit, wherein the path means has substantially infinite resistance between the second potential and the control circuit when said electrical charge passes through said path means, a method for programming the device comprising the steps of:
detecting a defective row of the normal memory cells; and
opening at least one fuse element so that the first address matches the address of the defective row.

40. An electrical circuit coupled between a first potential and a second potential for providing a programmable voltage level at an output node comprising:
a fuse element having a first terminal coupled to said output node and a second terminal coupled to said first potential; and
means for selectively providing, in response to a clock signal, a path for passing electrical charge between said second potential and said output node, wherein the path means has substantially infinite resistance between said second potential and said output node when said electrical charge passes through said path means.
the path means comprising capacitive means for storing an electrical charge in response to a first state of the clock a clock signal and for providing said electrical charge to said output node in response to a second state of the clock signal.

* * * * *